United States Patent
Fantini et al.

(10) Patent No.: US 9,263,128 B2
(45) Date of Patent: *Feb. 16, 2016

(54) METHODS AND APPARATUSES FOR PROGRAMMING MEMORY CELLS

(71) Applicant: MICRON TECHNOLOGY, INC., Boise, ID (US)

(72) Inventors: Paolo Fantini, Vimercate (IT); Massimo Ferro, Camisano (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/679,781

(22) Filed: Apr. 6, 2015

(65) Prior Publication Data
US 2015/0213891 A1 Jul. 30, 2015

Related U.S. Application Data

(63) Continuation of application No. 14/099,754, filed on Dec. 6, 2013, now Pat. No. 9,001,573.

(51) Int. Cl.
*G11C 13/00* (2006.01)

(52) U.S. Cl.
CPC ........ *G11C 13/0069* (2013.01); *G11C 13/0004* (2013.01); *G11C 13/0033* (2013.01); *G11C 13/0061* (2013.01); *G11C 2013/0092* (2013.01)

(58) Field of Classification Search
CPC ........... G11C 13/0004; G11C 13/0033; G11C 13/0061; G11C 13/0069; G11C 2013/0092; G11C 16/10
USPC ................. 365/163, 148, 158, 185.2, 189.16, 365/210.1
See application file for complete search history.

(56) References Cited

U.S. PATENT DOCUMENTS

| | | | |
|---|---|---|---|
| 6,813,189 B2 | 11/2004 | Kurihara | |
| 7,289,351 B1 | 10/2007 | Chen et al. | |
| 7,656,710 B1* | 2/2010 | Wong ................. | G11C 11/5628 365/185.18 |
| 7,701,749 B2 | 4/2010 | Jeong et al. | |
| 7,940,553 B2 | 5/2011 | Wu et al. | |
| 8,144,508 B2 | 3/2012 | Franceschini et al. | |
| 8,446,753 B2 | 5/2013 | Kim et al. | |
| 8,611,135 B2 | 12/2013 | Wang et al. | |
| 8,929,124 B2 | 1/2015 | Kim et al. | |

(Continued)

FOREIGN PATENT DOCUMENTS

WO   WO 2011/080770   7/2011

OTHER PUBLICATIONS

International Search Report and Written Opinion of International Application No. PCT/US2013/063194, dated Jan. 22, 2014 in 9 pages.

(Continued)

*Primary Examiner* — Tan T Nguyen
(74) *Attorney, Agent, or Firm* — Holland & Hart LLP (57) ABSTRACT

Methods and apparatus for programming memory cells in a memory array are disclosed. A most recent programming time is determined, the most recent programming time being a time when a most recent programming operation was applied to a reference memory cell in the memory array. A programming signal is then applied to a target memory cell in the memory array, the programming signal having a programming parameter which depends at least in part on the most recent programming time.

20 Claims, 8 Drawing Sheets

(56) References Cited

U.S. PATENT DOCUMENTS

| | | |
|---|---|---|
| 8,958,233 B2 | 2/2015 | Chen |
| 9,001,573 B1 * | 4/2015 | Fantini et al. ............... 365/163 |
| 2004/0264234 A1 | 12/2004 | Moore et al. |
| 2005/0231999 A1 | 10/2005 | Moriyama |
| 2007/0047296 A1 | 3/2007 | Philipp et al. |
| 2008/0043521 A1 | 2/2008 | Liaw et al. |
| 2008/0175035 A1 | 7/2008 | Taguchi |
| 2009/0016100 A1 * | 1/2009 | Jeong ............... 365/163 |
| 2009/0052236 A1 | 2/2009 | Bae et al. |
| 2010/0188885 A1 | 7/2010 | Toda et al. |
| 2011/0194328 A1 | 8/2011 | Kim et al. |
| 2012/0014164 A1 | 1/2012 | Kamoshida et al. |
| 2012/0092923 A1 | 4/2012 | Bedeschi et al. |
| 2012/0147667 A1 | 6/2012 | Chen |
| 2013/0051114 A1 | 2/2013 | Kim et al. |
| 2013/0094275 A1 | 4/2013 | Chen |
| 2014/0098593 A1 | 4/2014 | Calderoni |
| 2014/0192588 A1 | 7/2014 | Lee et al. |

OTHER PUBLICATIONS

Boniardi, et al., "Physical Origin of the Resistance Drift Exponent in Amorphous Phase Change Materials" Jun. 16, 2011, 3 pages, Milano, Italy.

Related U.S. Appl. No. 13/275,901, entitled "Stabilization of Resistive Memory" Filed Oct. 18, 2011, 28 pages.

* cited by examiner

METHODS AND APPARATUSES FOR PROGRAMMING MEMORY CELLS

REFERENCE TO RELATED APPLICATIONS

This application is a continuation of U.S. patent application Ser. No. 14/099,754, filed Dec. 6, 2013, entitled "METHODS AND APPARATUSES FOR PROGRAMMING MEMORY CELLS," which is hereby incorporated by reference in its entirety and made part of this specification.

BACKGROUND

1. Field

The present disclosure relates generally to methods and apparatuses for programming memory cells.

2. Description of the Related Art

Various types of memory technologies are available for electronic information storage, including various types of volatile and non-volatile memory technologies. The selection of a type of memory for an electronic application can depend on a number of factors, including for example, memory storage density, reliability, ease of manufacturability, and/or cost of operation. One or more programming operation performance characteristics may also be relevant factors when selecting the type of memory technology used in various electronic applications. Such characteristics include for example the speed and/or energy consumption performance of a programming operation. Consequently, to meet design criteria for various applications, there is continuing development in the programming performance of memories.

BRIEF DESCRIPTION OF THE DRAWINGS

Various features, aspects, and advantages of the present disclosure are described with reference to the drawings of certain embodiments, which are intended to illustrate certain embodiments and not to limit the disclosure. The drawings are not necessarily to scale.

DETAILED DESCRIPTION

Non-volatile memories, such as variable resistance memory, which can include for example phase change memory (PCM), can provide information storage for a wide variety of electronic applications. A reduced energy consumption in programming operations for these non-volatile memories may facilitate increased memory cell programming speed, improved memory cell reliability, and/or lower costs of memory device operation. It will be understood that a programming operation may program a memory cell by changing the state of that cell.

One or more methods and/or apparatuses for programming a memory cell described herein may provide a programming operation having reduced programming operation energy, thereby facilitating improved programming operation speed, reduced programming operation energy consumption and/or improved memory cell mechanical and/or electrical reliability. In some embodiments, the amount of energy applied to a target memory cell to change the state of that memory cell in a programming operation may depend at least in part on the time elapsed since a most recent programming operation was performed on a reference memory cell. For example, in some embodiments, this elapsed time can be determined by reference to a time stamp or value indicating the time (e.g., year, month, week, date, hour, minute, second, and/or other standard or arbitrary marker of time) when the immediately previous programming operation occurred, and/or by reference to an indicator that indicates the total amount of time that has passed since the previous programming operation for the reference memory cell. As used herein, the target memory cell is the cell to be programmed and the reference memory cell is the cell that provides the time used to determine amount of energy to be applied to the target cell. In some embodiments, the reference memory cell is the target memory cell. In some other embodiments, the reference memory cell is a different memory cell from the target memory cell.

It has been found that the applied energy sufficient to change the state of memory cells, such as phase change memory cells, can decrease with increasing time from the most recent change in state of the cell (e.g., time from a change from a set state to a reset state). In some embodiments, relative to the energy that may be required to program a target cell having a more recently programmed reference cell, a reduced amount of energy may be applied in a programming operation of a target memory cell with an increased period of time elapsed since a programming operation was most recently performed upon the reference memory cell. In some embodiments, a programming operation energy may be non-linearly related to the time the most recent programming operation was performed upon a reference memory cell (e.g., a most recent programming time) and/or a period of time elapsed since a most recent programming operation was performed upon a reference memory cell. For example, the programming operation energy may be logarithmically related to a most recent programming time in some embodiments. One or more methods and/or apparatuses described herein may provide a reduced programming operation energy for programming a memory cell having a PCM storage element from a reset state to a set state, and/or from a set state to a reset state.

Without being limited by theory, an amount of time elapsed since a most recent programming operation can be indicative of an amount of drift in an electrical and/or structural characteristic of a target memory cell. For example, an increased period of time since a most recent programming operation may be indicative of an increased period of time in which a drift in an electrical and/or structural in the target memory cell can occur. In some embodiments, the drift in the electrical and/or structural characteristic of the target memory cell can facilitate use of a lower programming operation energy in a subsequent programming operation, including a programming operation energy lower than that conventionally used for programming the target memory cell.

In some embodiments, a time value representative of a time of a previously performed programming operation (e.g., a most recent programming time), can be recorded and/or stored by the memory device, and can be updated continuously with a time indicative of a most recently performed programming operation (e.g., upon a subsequent performance of a programming operation on a reference memory cell, and the updating may be performed prior to, during, and/or subsequent to the programming operation performed upon the reference memory cell). The time value may be stored in a memory array of the memory device, for example, the array in which the target memory cell is disposed. In some embodiments, the time value can be stored in a volatile memory, for example to speed up retrieval of the time value, during operation of the memory device. For example, the time value can be stored in a dynamic random access memory (DRAM), static random access memory (SRAM) and/or any other suitable type of volatile memory. In some embodiments, the time value can be copied from the memory array in which the target memory cell is disposed to a volatile memory, for example after powering on of the memory device, such that the time value can be retrieved from the volatile memory during operation of the memory device. The time value in the memory array may be updated (e.g., periodically or upon a triggering event, such as a shut down signal) with values from the volatile memory.

In some embodiments, the time value may subsequently be used for determining a time period elapsed since the previous programming operation, including the most recent programming operation. This elapsed period may then be used to determine the programming operation energy. In some other embodiments, the time values may themselves be associated with particular programming operation energies.

In some embodiments, the time value representative of a time of a most recently performed programming operation may be indicative of a time at which a programming signal pulse of the most recently performed programming operation was applied to the reference memory cell, including a time at which the programming signal pulse was initiated, a time at which the program signal pulse was completed, or at any other time during application of the programming signal pulse. Of course, the time value may represent any other time of the most recent programming operation suitable for consistently determining a time and/or a period of time elapsed since the most recent programming operation.

In some embodiments, the time value can include year, month, week, date, hour, minute, second, and/or other standard or arbitrary marker of time for a previously performed programming operation (e.g., a most recently performed programming operation). In some embodiments, the time value can include only an hour and/or a date of a most recently performed programming operation. The degree of detail in the time value stored by a memory device may be configured to provide sufficient information regarding the time of a previously performed programming operation for determining a reduced programming operation energy, and/or one or more parameters of the programming operation, while providing a low memory storage requirement for storing the time value, thereby maintaining a high level of available memory storage for information other than the date value in the memory device.

As described herein, in some embodiments, the programming operation energy can have a non-linear dependence upon the time of the most recent programming operation. For example, a rate of reduction in a programming operation energy may decrease with increasing amounts of time since the most recent programming operation. In some embodiments, a memory device can store a time value having a degree of detail sufficient to provide a desired reduction in programming operation energy (e.g., as compared to an energy conventionally used) while using low levels of memory storage.

In some embodiments, the time value may be determined using a system time, for example a system time of a computing system to which the memory device is operationally coupled. For example, the time value can include the year, month, week, date, hour, minute, and/or second from the system time. In some embodiments, the time value includes a marker of time having a lesser degree of detail than the system time. For example, the time value may include a date and an hour while the system time includes a measure of time having a year, month, week, date, hour, minute and second. In some embodiments, the memory device can include an internal clock and the time value can be determined using the memory device internal clock. For example, the time value can include a year, month, week, date, hour, minute, and/or second from the time of the memory device internal clock. In some embodiments, the memory device internal clock can track a measure of time since the occurrence of an event, for example a most recent powering on of the memory device. For example, the memory device internal clock can track a number of hours since the most recent powering on of the memory device. In some embodiments, the measure of time since the most recent powering on of the memory device can be another suitable unit of time (e.g., minutes, seconds). The time value can include a marker of time based on the measure of time since the most recent powering on of the memory device (e.g., a number of hours since the most recent powering on of the memory device), and the time value can be reset upon each powering on of the memory device. For example, the time value can include the time of day (e.g., the hour of day, or another suitable marker of the time of day, such as the minute or second of the day) of a most recently performed programming operation, and the time value can be updated with a time indicative of a subsequent programming operation for programming the reference memory cell, reset at the start of another day, or reset upon each powering on of the memory device, whichever occurs first.

As described herein, the time value may be updated upon performance of a programming operation for programming the reference memory cell. For example, the time value can be updated each time the reference memory cell is programmed. In some embodiments, the time value can be updated when the reference memory cell is programmed from a set state to a reset state (e.g., the time value being updated with a time indicative of the time of the programming operation performed upon the reference memory cell to change the reference memory cell from the set state to the reset state). For example, the time value can be updated with a time indicative of a programming operation for changing the state of the reference memory cell from a set state to a reset state, and the time value may not be updated upon performance of a programming operation to change the state of the reference memory cell from the reset state to the set state. The time value may be updated prior to, during and/or subsequent to the programming operation.

In some embodiments, a time value may be updated routinely after a particular period of time and/or after the occurrence of an event (e.g., a powering on of the memory device) to facilitate use of time values having a lesser degree of detail. For example, the reductions in the programming operation energy may taper off after a predefined amount of time has passed, such that additional reductions are limited. As a result, in some embodiments, all time entries greater than that amount of time may be updated to have the same value. In some embodiments, all time entries may be reset after the occurrence of the event (e.g., reset after powering on of the memory device) to facilitate storing of a time value have a reduced degree of detail while facilitating application of a reduced programming operation energy.

A programming operation having a reduced programming operation energy can include one or more parameters where values for the one or more parameters can depend on the time when a previous programming operation was performed upon a reference memory cell (e.g., the time of a most recent programming operation), and/or the period of time elapsed since the previous programming operation, (e.g., the period of time elapsed since the most recent programming operation). Examples of parameters can include, but are not limited to, a programming operation duration, one or more parameters of a programming signal pulse of the programming operation, a number of programming signal pulses of the programming operation, and/or combinations thereof. One or more parameters of a programming signal pulse of the programming operation may include a programming signal pulse duration, a programming signal pulse amplitude, a programming signal pulse shape, and/or combinations thereof.

A voltage programming signal pulse and/or a current programming signal pulse may be used in a programming operation. The energy consumed in a programming operation using a current programming signal pulse in a resistive heating process can depend on the current value of a current programming signal and can be expressed according to equation (1): $E=(R \times I^2) \times t$, where E is the measure of energy consumed during programming of the target memory cell, I is a measure of current delivered to the target memory cell for programming the target memory cell (e.g., to provide the resistive heating), t is a period of time during which the current programming signal pulse is applied to the target memory cell, and R is a measure of the resistance of a heater element of the target memory cell through which resistive heating can be provided. In some other embodiments, the measure of energy consumed in a programming operation using a voltage programming signal pulse in a resistive heating process can depend on the voltage value of a voltage programming signal, and can be expressed according to equation (2): $E=V^2/R \times t$, where E is the measure of the energy consumed during programming of the target memory cell, R is a measure of a resistance of the heater element, and V is a measure of the voltage delivered to the target memory cell for programming the target memory cell (e.g., to provide the resistive heating), and t is a period of time during which the voltage programming signal pulse is supplied to the target memory cell. As described in equations (1) and (2), a quantity of energy consumed in programming a target memory cell can depend on the duration over which a programming signal pulse is applied to the target memory cell (e.g., the current programming signal pulse, and/or the voltage programming signal pulse), and/or a magnitude of the programming signal pulse (e.g., a voltage value of a voltage programming signal pulse, a current value of a current programming signal pulse) applied to the target memory cell during the programming operation.

A reduced programming operation energy may advantageously facilitate reduced energy consumption of a memory device, increased operation speed, and/or improved memory device reliability. For example, a reduced energy requirement for a programming operation may facilitate reduced thermal heating of the target memory cell, easing thermal expansion and/or contraction of one or more components of the target memory cell, and reducing the likelihood of unintentional heating of neighboring cells. Thermal heating from programming operations may contribute to a degradation of a physical and/or an electrical performance of the memory device. For example, thermal expansion and/or contraction of a target memory cell may degrade contact between components of the target memory cell (e.g., contact between a heater element and a phase change memory material component of a memory cell having a PCM storage element), reducing a reliability of the target memory cell (e.g., reducing reliability in a heating of the phase change memory material component, and/or increasing variability in a resistance performance of the phase change memory material component, of a memory cell having a PCM storage element). A reduced programming operation energy may facilitate faster memory cell programming speed, and/or lower costs of operating a memory device. For example, a reduction in a programming operation energy may advantageously facilitate reduced programming operation time for programming a memory cell having a PCM storage element from a reset state to a set state. Increasing a programming operation speed of a memory cell having a PCM storage element may facilitate use of PCM technology in an increased number of electronic applications.

Reference will now be made to the figures, in which like numerals refer to like parts throughout.

Figure 1:
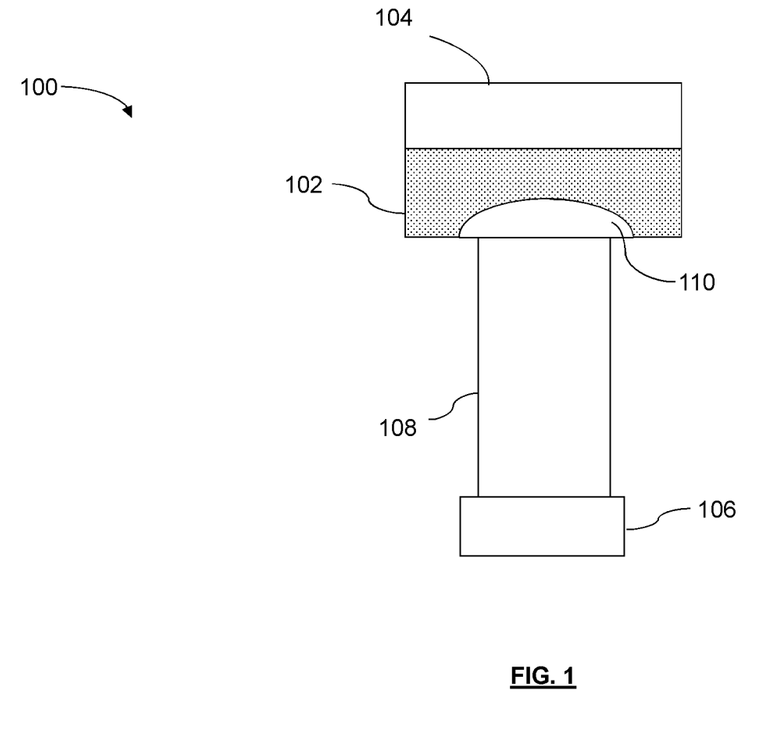
FIG. 1 shows an example of a schematic, cross-sectional view of a phase change memory storage element.

FIG. 1 shows one example of a schematic, cross-sectional view of a PCM storage element 100. It will be appreciated that a memory cell having a phase change memory (PCM) storage element can exhibit at least two stable states, for example a stable state in a crystalline phase and a stable state in an amorphous phase. A stable state in the crystalline phase may correspond to a "set" state, and a stable state in the amorphous state may correspond to a "reset" state, the set state providing a lower electrical resistance than the reset state. In a binary system, a "set" state may correspond to a "1" state, and a "reset" state may correspond to a "0" state. Of course, a memory cell may be programmed to more than two stable states, such as any one of three or more stable states. For example, a memory cell having a PCM storage element can include one or more intermediate stable states, including one or more stable states having a partially crystalline phase and/or a partially amorphous phase.

A memory array can include a plurality of memory cells, one or more of which can include a PCM storage element. With continued reference to FIG. 1, in some embodiments, the PCM storage element 100 can include a phase change material component 102 coupled to a heater element 108 and a first electrode 104. For example, the heater element 108 may be disposed along a lower edge of the phase change material component 102, and may contact the phase change material component 102. In some embodiments, the first electrode 104 can be disposed along an upper edge of the phase change material component 102, for example contacting the phase change material component 102. In other embodiments, the heater element 108 and/or the first electrode 104 may be disposed and coupled to the phase change material component 102 from other locations. In addition, the heater element 108 may be coupled to a second electrode 106. As shown in FIG. 1, in some embodiments, the PCM storage element 100 can include the heater element 108 and the phase change memory component 102 between the first electrode 104 and the second electrode 106.

The phase change material component 102 can include one or more materials which have multiple stable states that exhibit significantly different electrical resistance performance. For example, the phase change material may exhibit different electrical resistance when in an amorphous phase as compared to when in a crystalline phase. In some embodiments, the phase change material component 102 can include, for example, a chalcogenide glass material. In some embodiments, the phase change material component 102 can include a germanium-antimony-tellurium material (GST). The heater element 108 can be made of a variety of materials suitable for providing heating, e.g., resistive heating, of the phase change material component 102. For example, the heater element 108 can be made of a metallic material. In some embodiments, the heater element 108 can include a titanium silicon nitride material (TiSiN). The first electrode 104 and the second electrode 106 can include one or more suitable electrically conductive materials, for example to facilitate delivery of electrical signals to the phase change material component 102. For example, one or both of the first electrode 104 and the second electrode 106 may comprise titanium nitride (TiN).

Programming a memory cell having a PCM storage element, including PCM storage element 100 shown in FIG. 1, to any one of two or more stable states may include heating the phase change memory material to change in its state. For example, one or more electrical programming signal pulses (e.g., a voltage and/or a current programming signal pulse) may be delivered to the PCM storage element 100 such that the heater element 108 can provide resistive heating of the phase change memory material component 102, thereby inducing a phase change in all or part of the phase change material component 102 (e.g., thereby providing a portion 110 in which the phase has changed due to local heating).

Programming a PCM memory cell to a set state can include heating the phase change memory material of the storage element to a temperature higher than a crystallization temperature of the material but lower than a melting temperature of the material, and subsequently providing a period of time for cooling of the memory cell such that crystallization of the phase change memory material can occur. A programming operation for programming the memory cell to a reset state can include heating the phase change memory material to a temperature higher than the melting temperature of the material and subsequently providing a sufficiently rapid cooling of the memory cell such that the phase change material assumes or substantially assumes an amorphous phase.

Figure 2A:
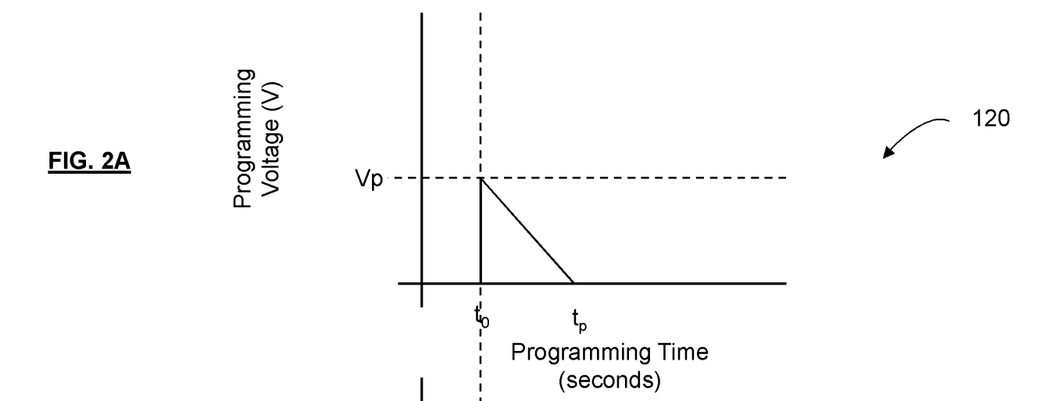
FIG. 2A shows an example of a programming signal pulse.

FIG. 2A shows an example of a programming signal pulse for programming a target memory cell. For example, a conventional programming operation (e.g., a programming operation configured to deliver an amount of programming operation energy conventionally used in programming the target memory cell in a memory cell array) for programming a target memory cell can include a voltage programming signal pulse 120. The example voltage programming signal pulse 120 includes a voltage signal pulse having a triangular shape. The voltage programming signal 120 can have a peak voltage magnitude value of about $V_p$ volts (V), and a programming signal pulse duration from about time $t_0$ to about time $t_p$. Other programming signal pulse shapes may also be suitable, including for example, a square shape, a trapezoid shape, a curved shape, and/or combinations thereof. In some embodiments, a programming operation can include a current programming signal pulse, for example instead of or in addition to a voltage programming signal pulse. In addition, the pulse may include two or more smaller pulses.

Figure 2B:
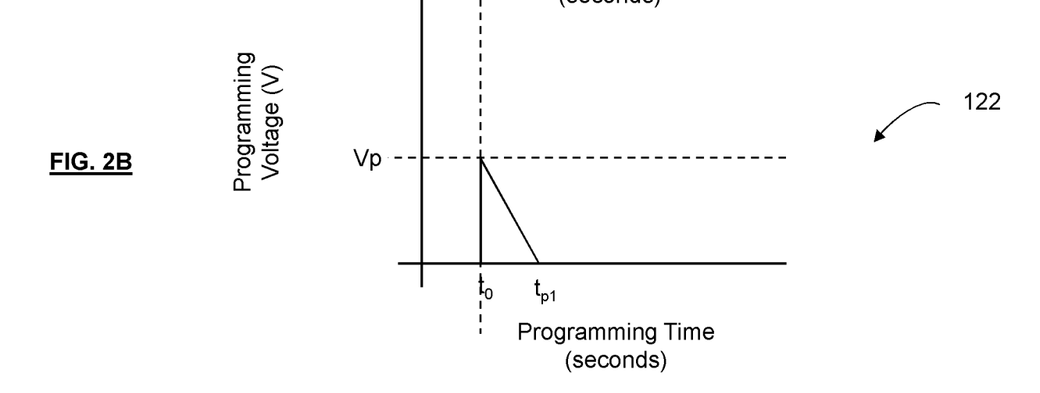
FIG. 2B shows an example of a programming signal pulse of a programming operation having a reduced programming operation energy.

As described herein, a programming operation having a reduced programming operation energy may facilitate a programing operation having increased programming speed (e.g., a reduced programming operation duration). Referring to FIG. 2B, a programming operation having reduced energy may include a voltage programming signal pulse 122. For example, a programming energy provided by voltage programming signal pulse 122 may be less than a programming energy provided by voltage programming signal pulse 120. As discussed herein, one or more parameters of the voltage programming signal pulse 122 can be determined based on a time a programming operation most recently performed on a reference memory cell (e.g., including a time period elapsed since a programming operation was most recently performed on a reference memory cell). The voltage programming signal pulse 122 can have a peak voltage magnitude value of $V_p$ volts, and a duration from about time $t_0$ to about $t_{p1}$. As shown in FIG. 2B, in some embodiments, the voltage programming signal pulse 122 can have a peak voltage magnitude value that is the same as or substantially the same as that in the voltage programming signal pulse 120, while having a reduced duration. For example, the period of time between $t_0$ to about $t_{p1}$ may be shorter than the duration of the programming signal pulse 120 (e.g., the duration from $t_0$ to about $t_p$). Where the programming signal pulses have a triangular shape, the decreasing portion of the programming signal pulse 122 may have a greater slope than the corresponding decreasing portion of signal pulse 120.

In some embodiments, a programming operation parameter other than a programming signal pulse duration can be determined based on the time when a most recent programming operation was performed on a reference memory cell. For example, the parameter may be the amplitude of the pulse, or the shape of the pulse. In some embodiments, two or more of the parameters of duration, amplitude, and shape are determined based upon the time when the most recent programming operation for the reference cell occurred.

Figure 3:
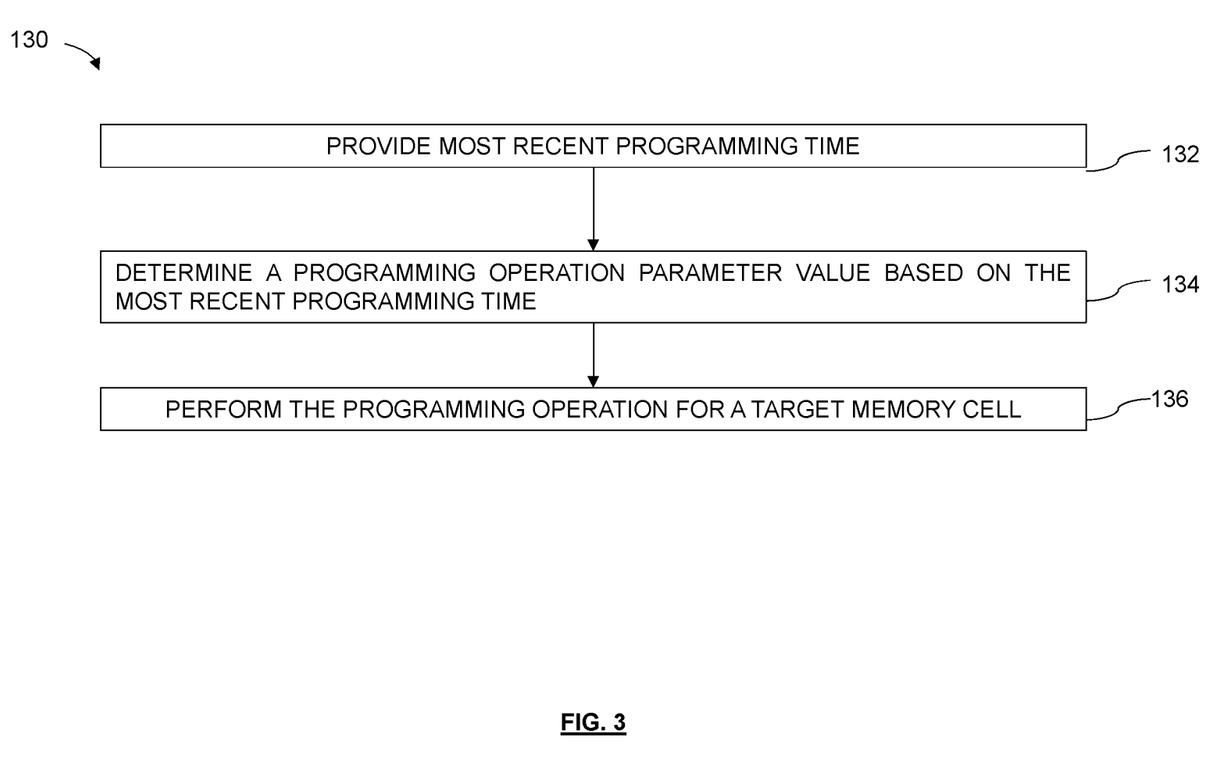
FIG. 3 shows an embodiment of a process for programming a memory cell using a programming operation having a reduced programming operation energy.

FIG. 3, shows an example of a process for programming a target memory cell where one or more programming operation parameters can be based on a time at which an immediately previous programming operation was applied to a reference memory cell. In the memory cell programming process 130 shown in FIG. 3, block 132 includes providing a most recent programming time for a reference memory cell of a memory array. In block 134, a programming operation parameter value may be determined based on the most recent programming time. For example, a parameter value of a programming signal pulse for programming the target memory cell may be determined based on the most recent programming time. In block 136, a programming operation including the programming operation parameter may be performed for programming the target memory cell. For example, a programming signal pulse having the parameter may be applied to the target memory cell.

The reference memory cell can be a memory cell in the same memory array as the target memory cell. In some embodiments, the reference memory cell and the target memory cell can be the same memory cell. For example, a most recent programming time can be indicative of a time at which the target memory cell was most recently programmed, such that a programming operation performed upon the target memory cell can include a programming operation parameter which depends on a period of time elapsed since a programming operation was previously applied to the target memory cell.

In some embodiments, the reference memory cell can be the most recently programmed memory cell of a portion of the memory array. For example, the most recent programming time can be indicative of a time at which a programming operation was most recently applied to any memory cell within the portion of the memory array. The portion can be a page, a sector, a block, a tile, and/or any other suitable sub portion of the memory array. For example, the most recent programming time can be indicative of a time at which any memory cell of a sector, a block, a tile, and/or a page of a memory array was most recently programmed. In some embodiments, one time value indicative of a time at which a programming operation was most recently applied to any memory cell within a portion of the memory array can be recorded and/or stored. Storing one time value for a portion of the memory array can facilitate reduced demand for available memory used in storing programming time value, facilitating for example increased memory storage in the memory device for information other than the time value, while providing sufficient information for providing a reduced programming operation energy.

Figure 4:
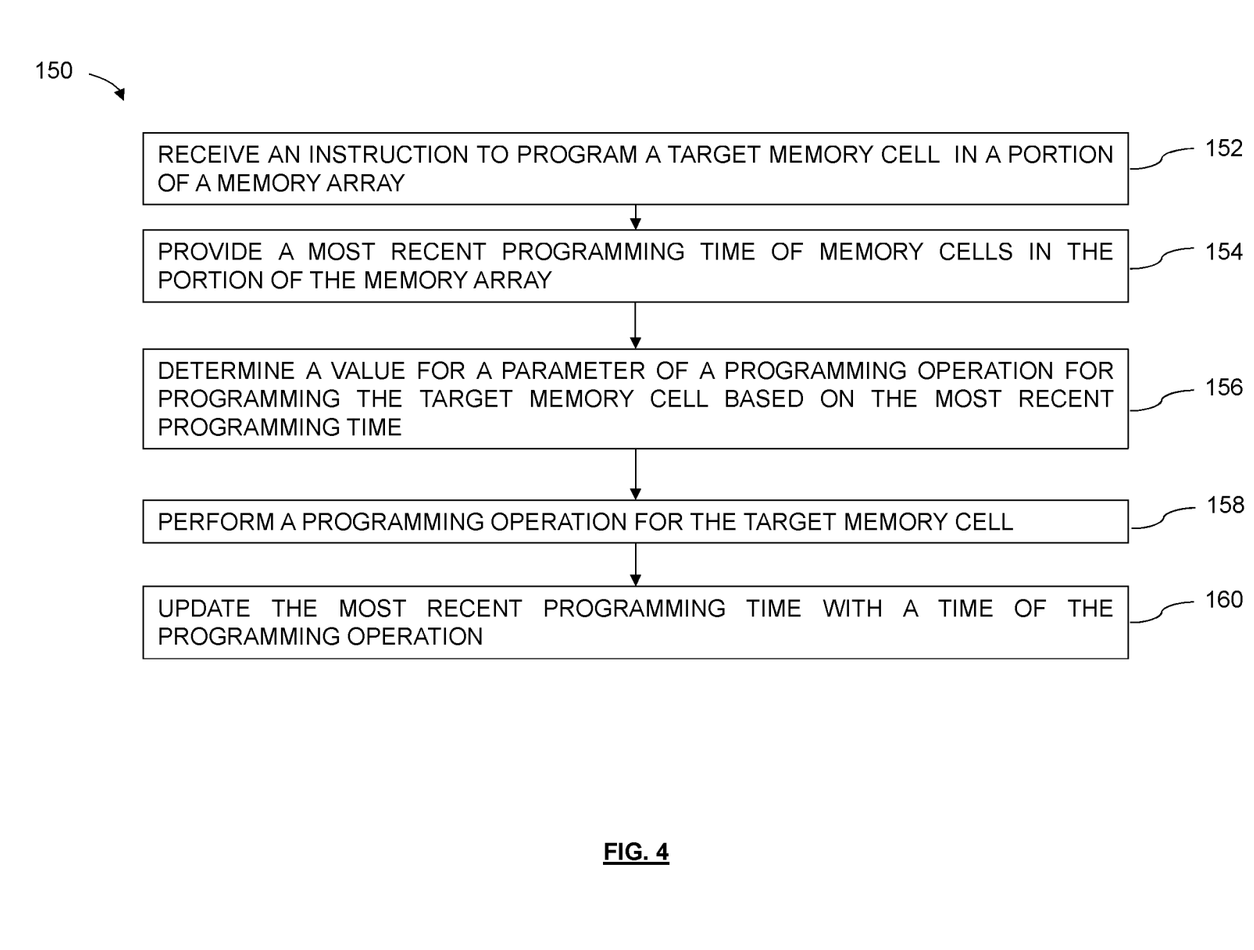
FIG. 4 shows another embodiment of a process for programming a memory cell using a programming operation having a reduced programming operation energy.

FIG. 4 shows another example of a process for programming a target memory cell. Memory cell programming process 150 can include, in block 152, receiving an instruction to program a target memory cell in a portion of a memory array. In block 154, the memory cell programming process 150 can include providing a most recent programming time indicative of a time at which the portion of the memory array was most recently programmed. In block 156, a value of a programming operation parameter can be determined based on the most recent programming time. In block 158, the memory cell programming process 150 can include performing a programming operation having the programming operation parameter value determined in block 156. In some embodiments, the most recent programming time can be updated in block 160. For example, the most recent programming time can be updated with a time of the programming operation of the target memory cell. In some embodiments, the most recent programming time can be updated each time a memory cell in the portion of the memory array is programmed. In some embodiments, the most recent programming time is updated each time a memory cell in the portion of the memory array is programmed from a set state to a reset state. For example, updating the most recent programming time in block 160 can be performed in a process for programming the target memory cell if the programming operation performed in block 158 changes the target memory cell from a set state to a reset state, and is not performed if the programming operation performed in block 158 changes the target memory cell from a reset state to a set state. In some embodiments, updating the most recent programming time for the portion of the memory array is not performed during the programming process 150 and is instead performed subsequent to the programming process 150 upon programming of another memory cell in the portion of the memory array from a set state to a reset state. As discussed herein, the most recent programming time can be stored in the memory array.

In some embodiments, a time period elapsed since the most recent programming operation can be determined based on the most recent programming time determined in block 154. For example, the value of the programming operation parameter determined in block 156 can be based on the period of time elapsed since a most recent programming operation was performed on a portion of the memory array. For example, a programming signal pulse parameter value of the programming operation can be determined based on a period of time elapsed since a programming operation was most recently performed upon any memory cell in the memory array portion.

A variety of methods and/or processes may be used in block 156 in determining the value of a parameter for the programming operation. In some embodiments, the value of the programming operation parameter can be determined using a look-up table and/or an algorithm. For example, the algorithm may be configured to perform various computations for determining the programming operation parameter value. In some embodiments, the algorithm may use the look-up table in performing various computations.

In some embodiments, the value of a programming operation parameter can be determined by selecting a value from a look-up table. For example, the selection may be made based on a comparison between the most recent programming time and threshold time values. Threshold time values may include pre-determined time values such that a selection of a value from a look-up table based on a comparison between the most recent programming time and the threshold values can facilitate providing a programming operation having a desired programming operation energy. For example, each threshold time value may be associated with a corresponding programming operation energy value and/or a corresponding programming operation parameter value, such that the corresponding programming operation energy value and/or programming operation parameter value can be selected based on whether the most recent programming time is greater than or less than the associated threshold time value. In some embodiments, a programming operation parameter value can be determined based on the comparison, for example, without first determining a programming operation energy. In some embodiment, threshold time values may be compared with a period of time elapsed since the most recent programming time.

Figure 5:
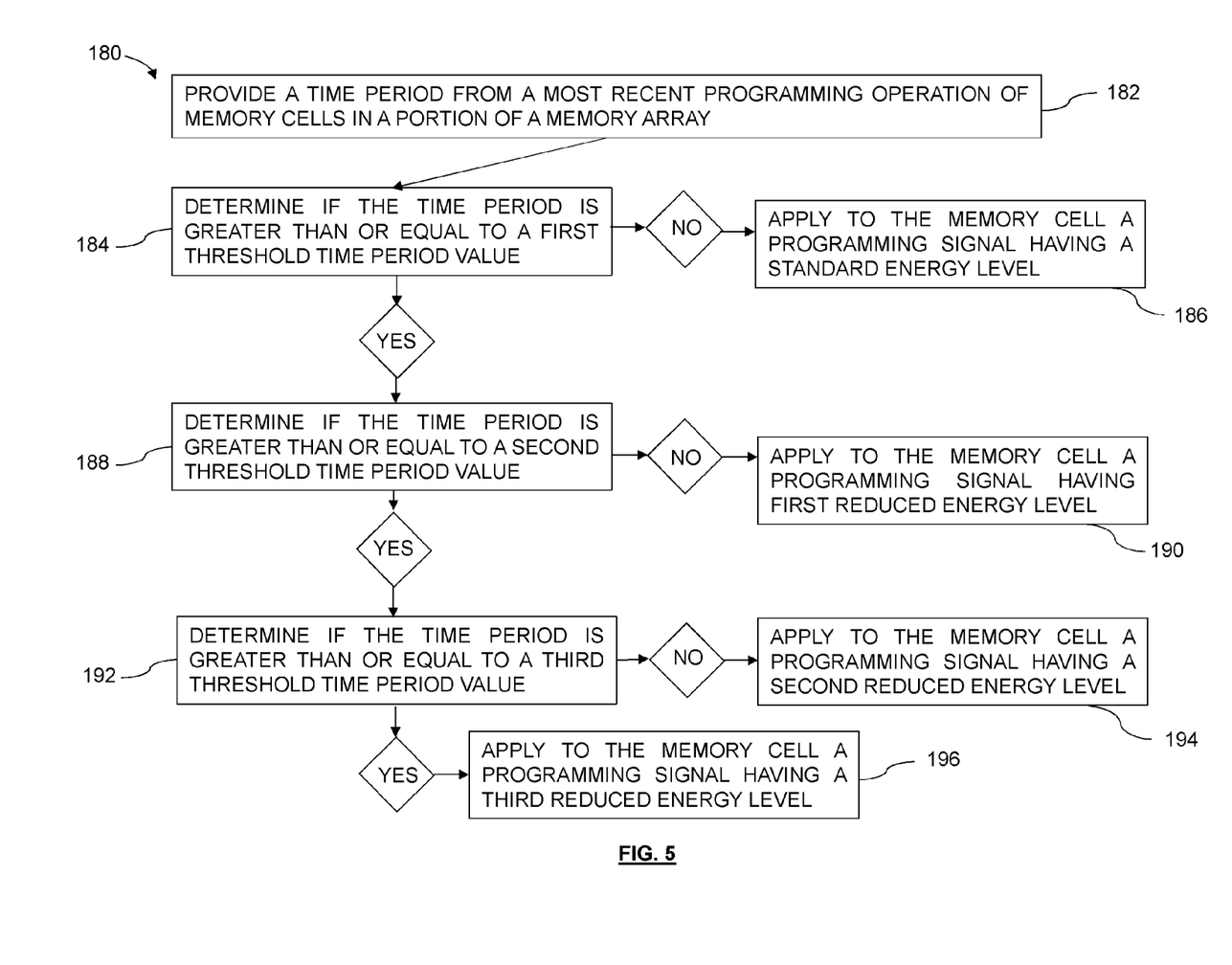
FIG. 5 shows an embodiment of a process for determining a programming operation energy.

In some embodiments, as shown in FIG. 5, threshold time values can be used in determining a programming operation energy. FIG. 5 shows an example of a process 180 for determining a programming operation energy based on a time period elapsed since a most recent programming operation. In block 182, a time period elapsed since a most recent programming operation can be provided. In block 184, a comparison is made between the time period and a first threshold time period value. If the time period is not greater than or equal to the first threshold time period, then a programming operation having a first energy can be applied to the target memory cell at block 186. For example, the first energy value may be at what will be referred to as a "standard" energy level, that is, an energy level sufficient to program any memory cell in the array (e.g., to change from a reset to a set state), irrespective of the time elapsed since that memory cell was last subjected to a programming operation.

If the time period is greater than the first threshold time value, then a comparison is made with a second threshold time value at block 188. If the time period elapsed since the most recent programming operation is not greater than or equal to the second threshold time value, then a programming operation having a second energy value can be applied to the target memory cell at block 190. For example, the second energy value may be a reduced energy level compared to the first energy value. If the time period elapsed from the most recent programming operation is greater than the second threshold value, then a comparison is made with a third threshold time value at block 192. If the time period is not greater than or equal to the third threshold, then a second reduced energy value can be selected for programming the target memory cell at block 194. For example, the second reduced energy value may have a value less than the first reduced energy value. Alternatively, if the time period is greater than the third threshold time value, then a programming operation having a third reduced energy value can be applied to the target memory cell at block 196. Of course, more or fewer threshold time values can be used for comparison in a process to determine a programming operation energy value. In some embodiments, a most recent programming time value may be used for comparison with one or more threshold time values. As described herein, in some embodiments, a programming operation parameter can be determined, instead of and/or in addition to a programming operation energy value, based on comparison with one or more threshold time values.

In some embodiments, the first threshold time period can be about one hour. For example, a standard programming operation energy may be applied to the target memory cell if the period of time elapsed since a most recent programming time is less than about an hour. In some embodiments, the second threshold time period can be about one day. For example, a programming operation energy having a first reduced programming operation energy level (e.g., a programming operation energy less than the standard energy level) may be applied to the target memory cell if the period of time elapsed since a most recent programming time is greater than or equal to about an hour but less than about one day. In one embodiment, the first reduced energy level can be about 25% to about 35% less than the standard energy level, including about 30% less than the standard energy level. In some embodiments, the third threshold time period can be about two days. For example, a programming operation energy having a second reduced energy level (e.g., a programming operation energy less than the first reduced energy level) may be applied to the target memory cell if the period of time elapsed since a most recent programming time is greater than or equal to about one day but less than about two days. In some embodiments, the second reduced energy level can be about 45% to about 55% less than the energy level of a standard programming operation, including about 50% of the standard programming operation energy. In some embodiments, a programming operation energy having a third reduced energy level (e.g., a programming operation energy less than the second reduced energy level) may be applied to the target memory cell if the period of time elapsed since a most recent programming time is greater about two days. For example, a third reduced energy level may be about 65% to about 75% less than that used in a standard programming operation, including about 75% less and about 70% less. For example, the third reduced energy level can be about 30% of the standard programming operation energy.

Of course, other reduced programming operation energy levels, threshold time periods, and/or a number of reduced programming operation energy levels, threshold time periods may also be suitable. In some embodiments, a value of one or more of the reduced programming operation energy levels and/or threshold time periods, and/or a number of reduced programming operation energy levels and/or threshold time periods, may depend on one or more characteristics of the target memory cell, including for example a material and/or a composition of the target memory cell.

Figure 6:
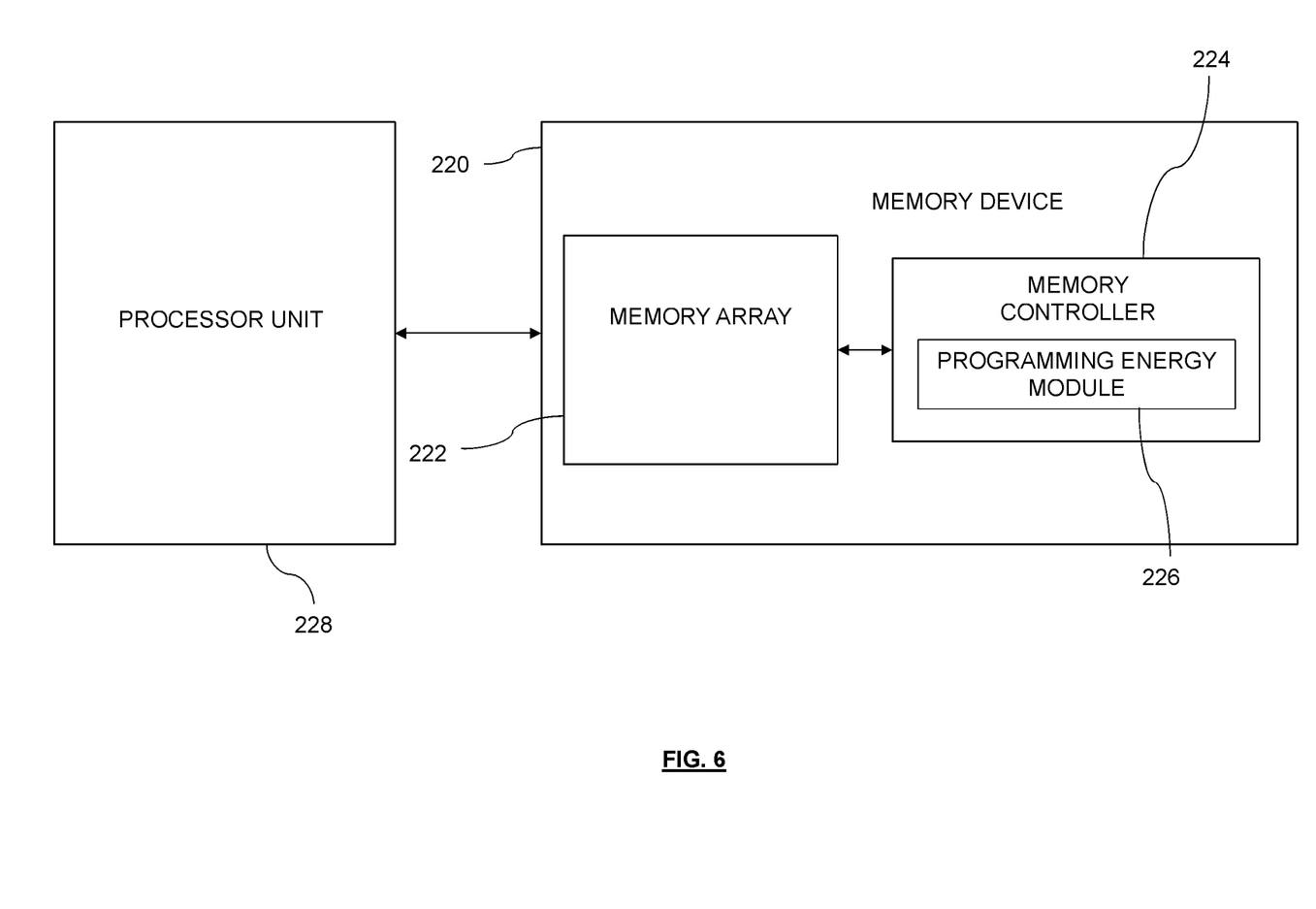
FIG. 6 schematically illustrates an embodiment of a memory device.

FIG. 6 shows an example of a memory device 220 configured to provide a programming operation having a reduced programming operation energy. In some embodiments, the memory device 220 can include a memory array 222, a memory controller 224 and a programming energy module 226. In some embodiments, as shown in FIG. 6, the programming energy module 226 may be within the memory controller 224. Various types of memory technologies may be suitable for memory device 220. In some embodiments, the memory array 222 can include resistance variable memory, such as a plurality of PCM memory cells. The memory controller 224 can include one or more components for programming and/or reading one or more memory cells of the memory array 222, as described herein. The programming energy module 226 of the memory controller 224 can include one or more components configured to facilitate provision of programming operations having a reduced energy level, as described herein. In some embodiments, the memory device 220 is operatively coupled to a processor unit 228. The processor unit 228 can include a variety of computing devices configured for providing one or more memory access commands for accessing memory array 222 of the memory device 220. For example, the processor unit 228 may be configured to provide instructions to initiate one or more programming operations for programming one or more target memory cells of the memory array 222 in the memory device 220.

As described herein, a time value indicative of a time at which a previous programming operation was applied to a reference memory cell can be stored to facilitate a determination of a programming operation energy. For example, the time value may be stored in the memory array 222. In some embodiments, the time value can be stored in a designated portion of the memory array 222. In some embodiments, the time value can be stored in a same portion of the memory array 222 as the target memory cell and/or the reference memory cell, such as a same sector, page, tile and/or block. In some embodiments, a memory controller 224 can include one or more look-up tables and/or logic circuitry for determining a programming operation energy and/or one or more parameters of a programming operation. In some embodiments, the look-up tables can be stored elsewhere in the memory device, including in the memory array 222. For example, a look-up table may be used to store one or more threshold time values and/or corresponding reduced energy levels for determining a programming operation energy (e.g., threshold time values as described in FIG. 5).

Figure 7:
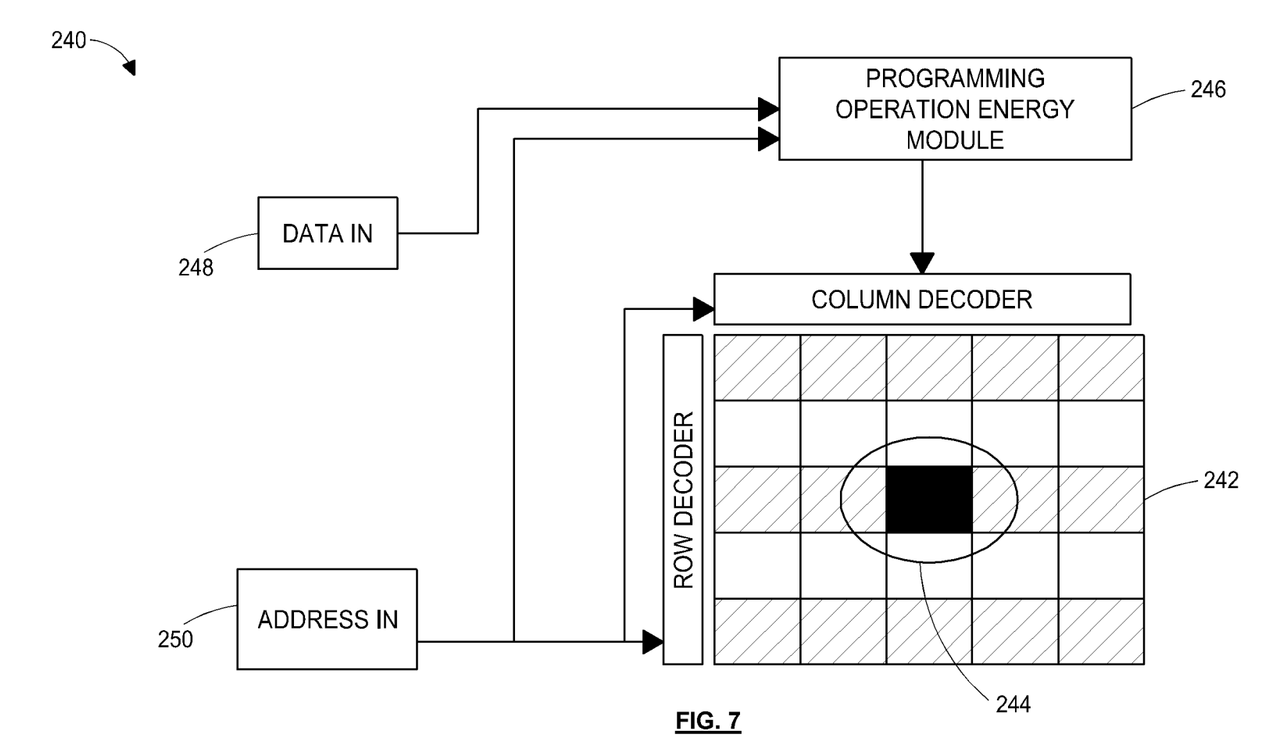
FIG. 7 schematically illustrates an example of a memory apparatus configured to provide a programming operation having a reduced programming operation energy.

In some embodiments, FIG. 7 shows an example of a memory apparatus 240 configured to provide a programming operation having a reduced programming operation energy. The apparatus 240 may include a memory array 242 including a target memory cell 244. The memory apparatus 240 can include a programming operation energy module 246 configured to determine a programming operation energy and/or one or more parameters of the programming operation for programming the target memory cell 244. For example, an address for a target memory cell may be provided to a programming operation energy module 246 (e.g., from an address module of the memory apparatus (now shown)). The programming operation energy module 246 may also receive programming operation energy related information 248 (e.g., a most recent programming time) such that the programming operation energy module 246 can perform one or more computations to determine the programming operation energy and/or one or more parameters of the programming operation. The programming operation energy module 246 may provide information relating to the programming operation energy and/or one or more parameters of the programming operation (e.g., information relating to one or more parameters of a programming signal pulse of the programming operation, including a programming signal pulse duration, a programming signal pulse amplitude, and/or a programming signal pulse shape) for programming the target memory cell 244. In some embodiments, the programming operation energy module 246 can update the programming operation energy related information 248 (e.g., update the most recent programming time to reflect a time of a most recently performed programming operation). A reference memory cell used in determining the programming operation energy and/or one or more parameters for the programming operation may be the target memory cell 244, and/or any other memory cell in the memory array 242 and/or a sub-portion of the memory array 242 in which the target memory cell 244 is located. For example, the reference memory cell may be the most recently programmed memory cell (e.g., the memory cell which was most recently programmed from a set state to a reset state) in the portion of the memory array 242 in which the target cell 244 is located.

Figure 8:
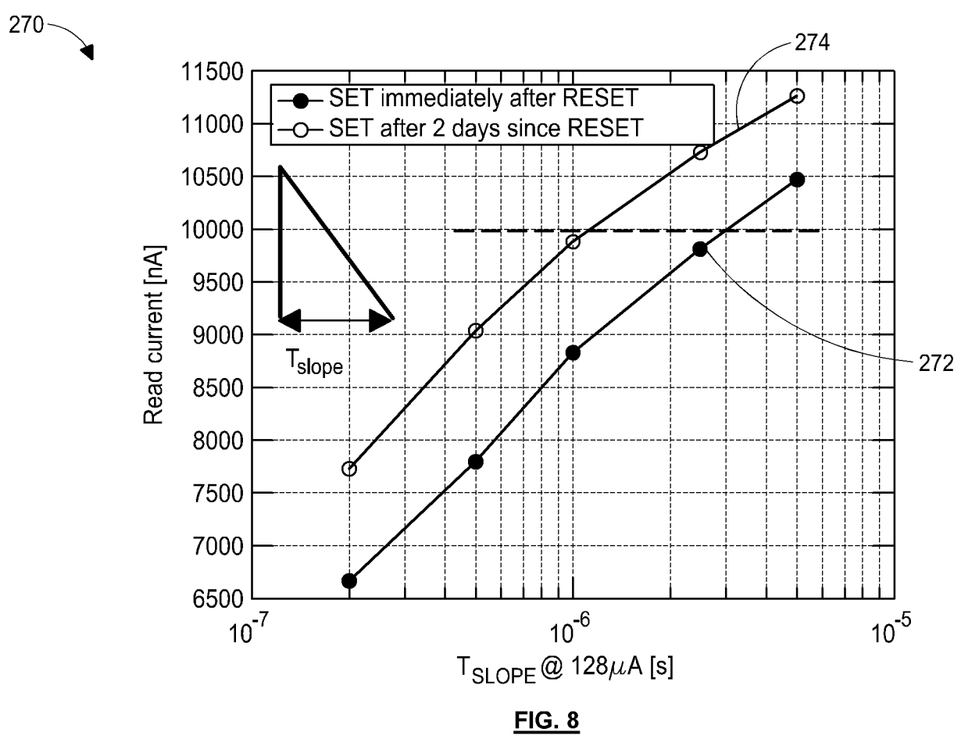
FIG. 8 shows an example of a read current performance of memory cells.

FIG. 8 includes a read current graph 270 showing example read current performances of memory cells having a PCM storage element. Read current graph 270 graphs read current performance of memory cells in set state against a duration of a programming operation used in programming the memory cell to the set state. Read current performance curve 272 represents read current performance of a memory cell which was programmed to a set state from a reset state immediately after or substantially immediately after (e.g., within 1 microsecond (µs)) a most recent programming operation (e.g., since a programming operation used to program the memory cell to the reset state). Read current performance curve 274 shows read current performance of a memory cell which was programmed to the set state from a reset state after a period of more than two days have elapsed since the most recent programming operation (e.g., since the programming operation used to program the memory cell to the reset state). The memory cell corresponding to the read current performance curve 272 and the memory cell corresponding to the read current performance curve 274 may be in the same memory array. In the example shown in FIG. 8, a programming operation to program the memory cells to the set state can include application of a current programming signal pulse having a triangular shape.

As shown in FIG. 8, the memory cell corresponding to read current performance curve 274 can demonstrate a read current of about 10 microamperes (µA) after being subject to a set programming operation having a duration of about 1 microsecond (µs), whereas the memory cell corresponding to read current performance curve 272 can demonstrate a read current of about 10 microamperes (µA) after being subject to a set programming operation having a duration of about 3 microseconds (µs). In the example shown in FIG. 8, a programming operation duration of a memory cell programmed after more than about two days after a most recent programming operation can be about a third of that of a memory cell which was programmed immediately or substantially immediately after a most recent programming operation (e.g., a programming signal pulse of the programming operation can have a reduced duration).

Accordingly, in some embodiments, a method of programming memory cells in a memory array may include determining a most recent programming time, the most recent programming time being a time when a most recent programming operation was applied to a reference memory cell in the memory array, and performing a programming operation comprising applying a programming signal to a target memory cell in the memory array, the programming signal having a programming parameter which depends at least in part on the most recent programming time.

Accordingly, in some other embodiments, a memory device may include a memory array comprising a plurality of memory cells; and a memory controller. The memory controller may be configured to: determine a most recent programming time, the most recent programming time being a time when a most recent programming operation was applied to a reference memory cell in the memory array; and to perform a programming operation comprising applying a programming signal to a target memory cell in the memory array, the programming signal having a parameter which depends at least in part on the most recent programming time.

Accordingly, in some other embodiments, a memory system may include a memory array including a plurality of memory cells, a processor configured to execute instructions to program memory cells of the memory array. The memory system may include a memory controller configured to: determine a most recent programming time, the most recent programming time being a time when a most recent programming operation was applied to a reference memory cell in the memory array; and to perform a programming operation comprising applying a programming signal to a target memory cell in the memory array, the programming signal having a parameter which depends at least in part on the most recent programming time.

Although this description has been disclosed in the context of certain embodiments and examples, it will be understood by those skilled in the art that the description extends beyond the specifically disclosed embodiments to other alternative embodiments and/or uses of the description and modifications and equivalents thereof. For example, while the disclosure herein includes descriptions of various embodiments in connection with phase change memory (PCM) for illustrative purposes, the principles and advantages described herein may be applied to other suitable types of memory. For example, the principles and advantages described herein can be applied to any memory in which a reduced programming operation energy may be used for programming a memory cell where the reduced programming operation energy is determined based at least in part on a time when a previous, such as a most recent, programming operation was performed on a reference memory cell. In addition, while several variations of the embodiments of the description have been shown and described in detail, other modifications, which are within the scope of this description, will be readily apparent to those of skill in the art based upon this disclosure. It is also contemplated that various combinations or sub-combinations of the specific features and aspects of the embodiments may be made and still fall within the scope of the description. It should be understood that various features and aspects of the disclosed embodiments can be combined with, or substituted for, one another in order to form varying modes of the embodiments of the disclosed description. Thus, it is intended that the scope of the description herein disclosed should not be limited by the particular embodiments described above.

The headings provided herein are for convenience only and do not necessarily affect the scope or meaning of the devices and methods disclosed herein.

What is claimed is:

1. A method of programming a target memory cell, comprising:
   applying a programming signal to the target memory cell, wherein the programming signal comprises a parameter which depends on a time value indicative of a most recent programming time, and
   wherein the most recent programming time is a time when a most recent programming operation was performed upon a reference memory cell.

2. The method of claim 1, wherein the time value is indicative of an hour and a date of the most recent programming time.

3. The method of claim 1, wherein the time value is indicative of a time period elapsed from the most recent programming time.

4. The method of claim 1, wherein the most recent programming operation comprises a programming operation for transitioning the reference memory cell from a reference memory cell set state to a reference memory cell reset state.

5. The method of claim 1, further comprising updating the time value in response to performing a programming operation comprising applying a programming signal to the target memory cell.

6. The method of claim 1, further comprising comparing the time value with at least one threshold time value of a plurality of threshold time values, wherein the parameter of the programming signal is based on the comparing the time value with the at least one threshold time value.

7. The method of claim 6, further comprising storing the plurality of threshold time values and a corresponding programming signal parameter value associated with each of the plurality of threshold time values in a look-up table.

8. The method of claim 7, wherein applying the programming signal comprises selecting a programming signal parameter value from the look-up table based on comparing the time value with the at least one threshold time value, and applying a programming signal to the target memory cell comprising the programming signal parameter value.

9. A memory device, comprising:
a memory controller configured to perform a programming operation to program a target memory cell, wherein the programming operation comprises:
applying a programming signal to the target memory cell,
wherein the programming signal comprises a parameter which depends on a time value indicative of a most recent programming time, and
wherein the most recent programming time is a time when a most recent programming operation was performed upon a reference memory cell.

10. The memory device of claim 9, wherein the memory controller is further configured to determine a period of time elapsed from the most recent programming time, and wherein the parameter depends upon the period of time.

11. The memory device of claim 9, wherein the parameter comprises at least one of a duration of a programming signal pulse, a programming signal pulse amplitude, a programming signal pulse shape and a number of programming signal pulses.

12. The memory device of claim 9, wherein the memory controller is further configured to update the time value in response to a trigger event, wherein the trigger event comprises at least one of powering-on of the memory device and passage of a predetermined period of time.

13. The memory device of claim 12, wherein the memory controller is further configured to update the time value to a predetermined time value if the most recent programming time is older than a threshold time, the predetermined time value being a single time value for all most recent programming times older than the threshold time.

14. The memory device of claim 9, further comprising a memory array, wherein the target memory cell and the reference memory cell are in the same sector, page, tile or block of the memory array.

15. The memory device of claim 14, wherein the memory controller is further configured to update the time value each time a memory cell within the sector, page, tile or block of the memory array is programmed.

16. A system, comprising:
a memory controller configured to perform a programming operation to program a target memory cell, wherein the programming operation comprises:
applying a programming signal to the target memory cell,
wherein the programming signal comprises a parameter which depends on a time value indicative of a most recent programming time, and
wherein the most recent programming time is a time when a most recent programming operation was performed upon a reference memory cell; and
a processor configured to initiate a command for programming the target memory cell.

17. The system of claim 16, wherein the memory controller is further configured to compare the time value with at least one threshold time value of a plurality of threshold time values, wherein the parameter of the programming signal is based on the comparing the time value with the at least one threshold time value.

18. The system of claim 17, wherein the system further comprises a look-up table, and the memory controller is further configured to store the plurality of threshold time values and a programming signal parameter value associated with each of the plurality of threshold time values in the look-up table.

19. The system of claim 16, wherein the parameter comprises at least one of a duration of a programming signal pulse, a programming signal pulse amplitude, a programming signal pulse shape and a number of programming signal pulses.

20. The system of claim 16, wherein the target memory cell and the reference memory cell are phase change memory cells.

* * * * *